(12) United States Patent
Masaki et al.

(10) Patent No.: US 12,132,142 B2
(45) Date of Patent: Oct. 29, 2024

(54) METHOD OF MANUFACTURING SEMICONDUCTOR ELEMENT, AND SEMICONDUCTOR ELEMENT BODY

(71) Applicant: KYOCERA Corporation, Kyoto (JP)

(72) Inventors: Katsuaki Masaki, Kyoto (JP); Kentaro Murakawa, Kyotanabe (JP)

(73) Assignee: KYOCERA CORPORATION, Kyoto (JP)

( * ) Notice: Subject to any disclaimer, the term of this patent is extended or adjusted under 35 U.S.C. 154(b) by 394 days.

(21) Appl. No.: 17/434,253

(22) PCT Filed: Feb. 28, 2020

(86) PCT No.: PCT/JP2020/008399
§ 371 (c)(1),
(2) Date: Aug. 26, 2021

(87) PCT Pub. No.: WO2020/175684
PCT Pub. Date: Sep. 3, 2020

(65) Prior Publication Data
US 2022/0140179 A1    May 5, 2022

(30) Foreign Application Priority Data
Feb. 28, 2019 (JP) .................... 2019-036097

(51) Int. Cl.
*H01L 33/00* (2010.01)
*H01L 23/00* (2006.01)
*H01L 33/40* (2010.01)

(52) U.S. Cl.
CPC .......... *H01L 33/0093* (2020.05); *H01L 24/05* (2013.01); *H01L 24/08* (2013.01);
(Continued)

(58) Field of Classification Search
CPC ... H01L 33/40; H01L 33/0075; H01L 33/007; H01L 24/80; H01L 24/08; H01L 24/05; H01L 33/0093
See application file for complete search history.

(56) References Cited

U.S. PATENT DOCUMENTS

2012/0280363 A1* 11/2012 Sumida ............... H01L 21/0237
257/E29.089
2017/0033186 A1   2/2017 Han et al.
2023/0260943 A1*  8/2023 Glancey ................. H01L 24/13
257/737

FOREIGN PATENT DOCUMENTS

JP  2007-096114 A   4/2007
JP     4638958 A  12/2010

* cited by examiner

*Primary Examiner* — Bradley Smith
(74) *Attorney, Agent, or Firm* — Procopio, Cory, Hargreaves & Savitch LLP

(57) ABSTRACT

A method of manufacturing a semiconductor element according to the present disclosure includes an element forming step (S1) of forming, on an underlying substrate (11), a semiconductor element (15) connected to the underlying substrate (11) via a connecting portion (13b) and including an upper surface (15a) inclined with respect to a growth surface of the underlying substrate (11), a preparing step (S2) of preparing a support substrate (16) including an opposing surface (16c) facing the underlying substrate (11), a bonding step (S3) of pressing the upper surface (15a) of the semiconductor element (15) against the opposing surface (16c) of the support substrate (16) and heating the upper surface (15a) to bond the upper surface (15a) of the semiconductor element (15) to the support substrate (16), and a peeling step (S4) of peeling the semiconductor element (15) from the underlying substrate (11).

8 Claims, 21 Drawing Sheets

(52) U.S. Cl.
CPC ............ *H01L 24/80* (2013.01); *H01L 33/007* (2013.01); *H01L 33/0075* (2013.01); *H01L 33/40* (2013.01); *H01L 2224/05073* (2013.01); *H01L 2224/05171* (2013.01); *H01L 2224/05573* (2013.01); *H01L 2224/05611* (2013.01); *H01L 2224/05644* (2013.01); *H01L 2224/08123* (2013.01); *H01L 2224/08145* (2013.01); *H01L 2224/08147* (2013.01); *H01L 2224/80365* (2013.01); *H01L 2224/80801* (2013.01); *H01L 2933/0016* (2013.01)

METHOD OF MANUFACTURING SEMICONDUCTOR ELEMENT, AND SEMICONDUCTOR ELEMENT BODY

TECHNICAL FIELD

The present disclosure relates to a method of manufacturing a semiconductor element, and a semiconductor element body.

BACKGROUND ART

A method of manufacturing a semiconductor element according to a related art is described, for example, in Patent Document 1.

CITATION LIST

Patent Literature

Patent Document 1: JP 4638958 B

SUMMARY

A method of manufacturing a semiconductor element according to the present disclosure may include an element forming step of forming, on an underlying substrate, a semiconductor element connected to the underlying substrate via a connecting portion and including an upper surface inclined with respect to a growth surface of the underlying substrate, a preparing step of preparing a support substrate including an opposing surface caused to face the underlying substrate, a bonding step of pressing the upper surface of the semiconductor element against the opposing surface of the support substrate and heating the upper surface to bond the upper surface of the semiconductor element to the support substrate, and a peeling step of peeling the semiconductor element from the underlying substrate.

A method of manufacturing a semiconductor element according to the present disclosure may include an element forming step of forming, on an underlying substrate, a semiconductor element connected to the underlying substrate via a connecting portion, a preparing step of preparing a support substrate including an opposing surface inclined with respect to a growth surface of the underlying substrate when the support substrate is caused to face the underlying substrate, a bonding step of pressing an upper surface of the semiconductor element against the opposing surface of the support substrate and heating the upper surface to bond the upper surface of the semiconductor element to the support substrate, and a peeling step of peeling the semiconductor element from the underlying substrate.

A method of manufacturing a semiconductor element according to the present disclosure may include an element forming step of forming, on an underlying substrate, a semiconductor element connected to the underlying substrate via a connecting portion, a preparing step of preparing a support substrate including an opposing surface caused to face the underlying substrate, the opposing surface including a stepped portion, a bonding step of pressing an upper surface of the semiconductor element against the opposing surface of the support substrate such that the upper surface of the semiconductor element and the stepped portion of the opposing surface of the support substrate come into contact with each other, and heating the upper surface, to bond the upper surface of the semiconductor element to the support substrate, and a peeling step of peeling the semiconductor element from the underlying substrate.

A semiconductor element body of the present disclosure may include a support substrate and a semiconductor element layer including a first surface and a second surface located on an opposite side to the first surface, wherein a side with the first surface is fixed to the support substrate, and the second surface is inclined with respect to a surface of the support substrate.

A semiconductor element body of the present disclosure may include a support substrate including an inclined surface, and a semiconductor element layer including a first surface and a second surface located on an opposite side to the first surface, wherein a side with the first surface is fixed to the inclined surface of the support substrate.

A semiconductor element body of the present disclosure may include a support substrate and a semiconductor element including a first surface and a second surface located on an opposite side to the first surface, wherein a side with the first surface is fixed to the support substrate, at least the first surface of the first surface and the second surface is inclined with respect to a surface of the support substrate.

Advantageous Effects of Invention

According to the method of manufacturing a semiconductor element of the present disclosure, the yield of the semiconductor element can be increased.

According to the semiconductor element body of the present disclosure, separation into individual semiconductor elements is facilitated, so that the yield of the semiconductor element can be increased.

DESCRIPTION OF EMBODIMENTS

The objects, features, and advantages of the present invention will become more apparent from the following detailed description and drawings.

In a semiconductor element and a method of manufacturing the same according to the present disclosure, a mask having a stripe-shaped slit is formed on an underlying substrate made of sapphire, gallium nitride (GaN), or the like. Then, a semiconductor is epitaxially grown from the substrate exposed from the slit, and the formed semiconductor element is transferred to a support substrate.

In the technology according to the present disclosure, when transferring the grown semiconductor element to the support substrate, after the semiconductor element is bonded to the support substrate, a force in a direction perpendicular to each surface of the underlying substrate and the support substrate is applied to break the connecting portion between the underlying substrate and the semiconductor element. At this time, when a force is applied between the support substrate and the semiconductor element, an electrode of the semiconductor element may be peeled off, and this leads to a high possibility of the semiconductor element not being reliably transferred to the support substrate, for example. Thus, the yield of the semiconductor element may not be improved.

Figure 1:
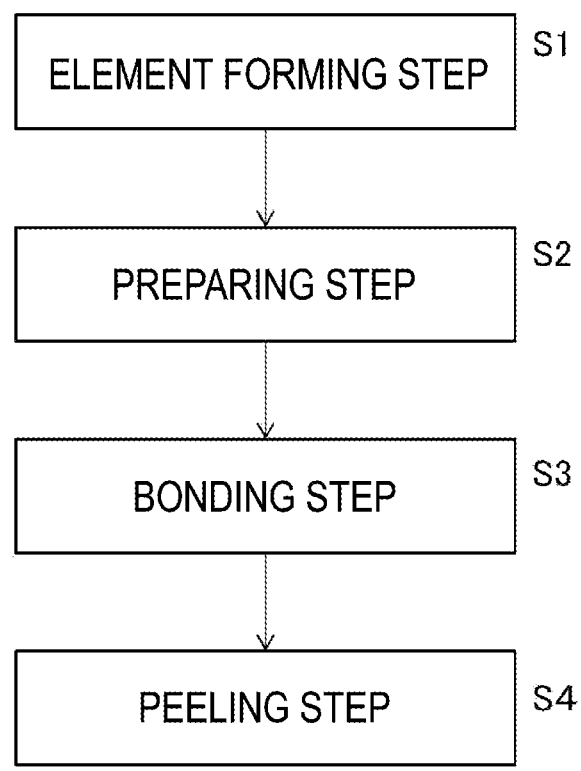
FIG. 1 is a process diagram of a method of manufacturing a semiconductor element according to an embodiment of the present disclosure.

Embodiments of the present disclosure will be described below with reference to each drawing schematically illustrated. FIG. 1 is a basic process diagram of a method of manufacturing a semiconductor element according to an embodiment of the present disclosure. A method of manufacturing a semiconductor element according to the present disclosure includes an element forming step S1 of forming a semiconductor element on an underlying substrate, a preparing step S2 of preparing a support substrate, a bonding step S3 of bonding the semiconductor element on the underlying substrate to the support substrate, and a peeling step S4 of peeling the semiconductor element from the underlying substrate. The element forming step S1 and the preparing step S2 need not be performed in this order, and for example, the element forming step S1 and the preparing step S2 may be performed in parallel.

First Embodiment (1) Element Forming Step S1

Figure 2A:
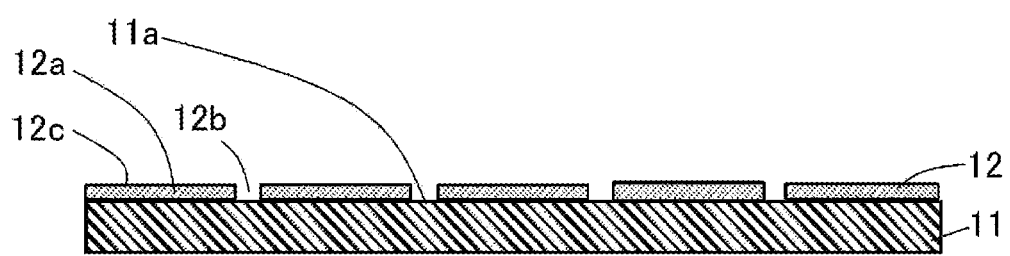
FIG. 2A is a cross-sectional view illustrating an element forming step according to a first embodiment.
Figure 2B:
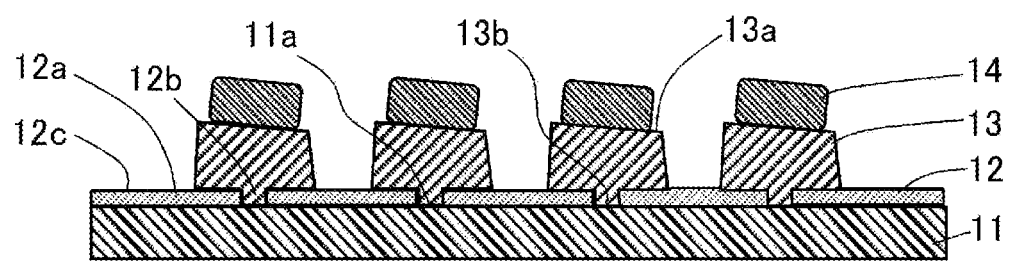
FIG. 2B is a cross-sectional view illustrating the element forming step according to the first embodiment.
Figure 2C:
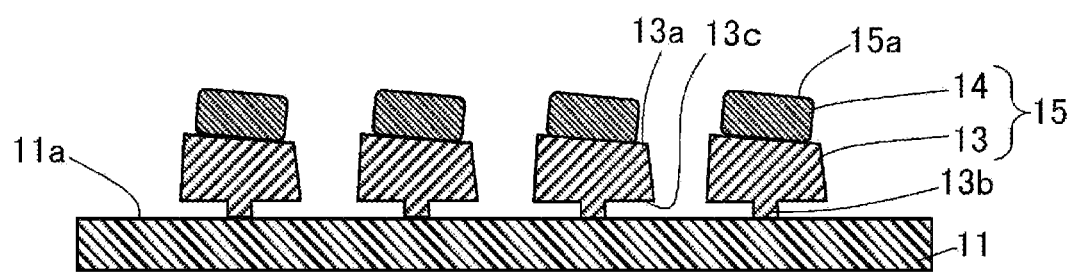
FIG. 2C is a cross-sectional view illustrating the element forming step according to the first embodiment.

FIGS. 2A to 2C are cross-sectional views illustrating the element forming step according to the first embodiment. As illustrated in FIG. 2A, first, an underlying substrate 11 is prepared. For example, a GaN template substrate is used as the underlying substrate 11. For example, the underlying substrate 11 is an off-angle substrate, and a normal direction of a growth surface 11a of the underlying substrate 11 (or the surface perpendicular to a thickness direction of the underlying substrate 11) is inclined by 0.3° from an a axis (<11-20>) direction. In the present embodiment, the off angle with respect to the a axis is 0.3°; however, a substrate having an off angle of from 0.1° to 1°, in other words, a substrate in which the growth surface 11a of the underlying substrate 11 is a crystal plane having an off angle with respect to the normal line of the growth surface 11a can be used. As the underlying substrate 11, for example, a GaN substrate cut out from a GaN single crystal ingot so that the growth surface 11a of the underlying substrate is in a predetermined plane direction can be used. As the underlying substrate 11, any nitride semiconductor substrate may be used. Alternatively, an n-type substrate or a p-type substrate in which the nitride semiconductor is doped with impurities may be used. Here, the "nitride semiconductor" is constituted by, for example, $Al_xGa_yIn_zN$ ($0 \le x \le 1$, $0 \le y \le 1$, $0 \le z \le 1$, $x+y+z=1$), and this similarly applies to the "nitride semiconductor" described below. As the GaN template substrate, for example, sapphire, Si, or SiC can be used.

Next, a mask 12 is formed on the underlying substrate 11. First, by using a plasma chemical vapor deposition (PCVD) method or the like to deposit a silicon oxide (for example, $SiO_2$ or the like), which is the material of the mask, on the underlying substrate 11, a $SiO_2$ layer of approximately 100 nm is layered on the growth surface 11a. Subsequently, the $SiO_2$ layer is patterned by a photolithography method and wet etching using buffered hydrogen fluoride (BHF) to form the mask 12 illustrated in FIG. 2A. The mask 12 has a stripe shape in which a plurality of strip-shaped portions 12a are arranged in parallel at a predetermined interval. A width of an opening portion 12b between adjacent strip-shaped portions 12a is, for example, approximately 5 μm. A width of each strip-shaped portion 12a is, for example, from approximately 50 μm to approximately 200 μm. The width of the opening portion 12b is, for example, from approximately 2 μm to approximately 20 μm.

The mask material for forming the mask 12 may be, in addition to $SiO_2$, a material in which a semiconductor layer does not grow from the mask material by vapor phase epitaxy. As the mask material, for example, an oxide, such as $ZrO_x$, $TiO_x$, or $AlO_x$, which can be patterned, or a transition metal, such as W or Cr can also be used. As the method of layering the mask layer, any method, such as vapor deposition, sputtering, or coating and curing, which are suitable for the mask material, can be used as appropriate.

Subsequently, as illustrated in FIG. 2B, a semiconductor element layer 13, which is a crystal growth layer of a semiconductor crystal, is vapor phase grown from the growth surface 11a exposed from the opening portion 12b. The semiconductor element layer 13 of the present disclosure is a nitride semiconductor layer.

As a method of crystal growth, vapor phase epitaxy (VPE) by a chloride transport method using a chloride as a group III raw material, or metal organic chemical vapor deposition (MOCVD) using an organic metal as a group III raw material can be used. A ratio of a raw material gas of a group III element, a ratio of a raw material gas of an impurity, and the like can be changed during the growth step to form the semiconductor element layer 13 as a multi-layer film that functions as an LED or an LD.

When the grown crystal exceeds the opening portion 12b of the mask 12, the crystal also grows laterally along a mask upper surface 12c. The crystal growth is completed before adjacent portions of the semiconductor element layer 13 grown from the growth surface 11a overlap with each other. In this manner, the semiconductor element layer 13, which is a nitride semiconductor grown by an epitaxial lateral overgrowth (ELO) method, is obtained. The width of the semiconductor element layer 13 is, for example, from approximately 50 μm to approximately 200 μm, and the height is from approximately 10 μm to approximately 50 μm.

Figure 3:
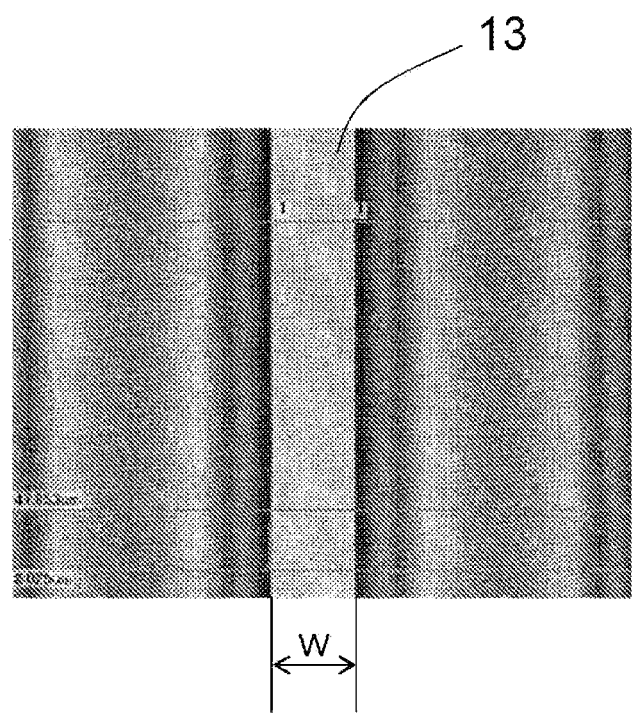
FIG. 3 is a photograph of a semiconductor element layer formed on an underlying substrate.
Figure 4:
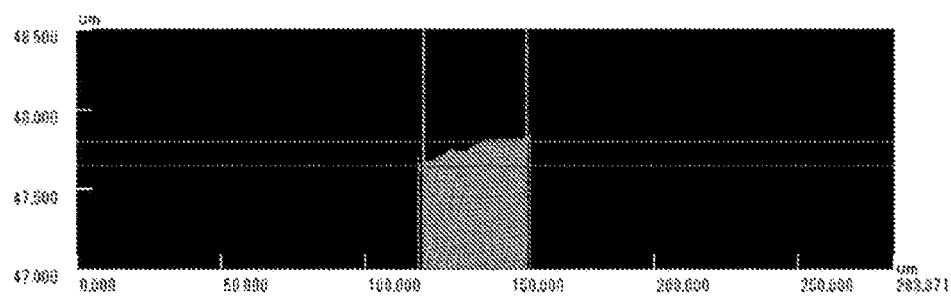
FIG. 4 is a graph illustrating an inclination of an upper surface of a semiconductor element layer.

FIG. 3 is a photograph of the semiconductor element layer formed on the underlying substrate, and is a top view of the semiconductor element layer formed on the mask by the above-described method. FIG. 4 is a graph showing an inclination of the upper surface of the semiconductor element layer, showing a measurement result of measuring a distance between the upper surface of the semiconductor element layer illustrated in FIG. 3 and a reference surface. A width W of the semiconductor element layer 13 formed in a strip shape is 35 μm, and in the width direction, the right end side is higher than the left end side, and the height difference between both ends is 150 nm. An inclination angle of a first surface 13a (upper surface) of the semiconductor element layer 13 is 0.25°. The off angle of the underlying substrate 11 used in the growth of the semiconductor element layer 13 is 0.22°, and the inclination angle of the first surface 13a corresponds to the off angle of the underlying substrate 11. Growing the semiconductor element layer 13 with the off angle on the underlying substrate 11 in this manner is advantageous for realizing the semiconductor element layer 13 of a crystal having excellent quality. The semiconductor element layer 13 has the first surface 13a and a second surface 13c located on the opposite side to the first surface 13a.

After the semiconductor element layer 13 is grown, a metal layer 14 is formed on the first surface 13a of the semiconductor element layer 13, as illustrated in FIG. 2B. First, the entire upper surface of the underlying substrate 11, the mask 12, and the semiconductor element layer 13 is covered with a resist film. Thereafter, an opening portion is provided using a photolithography method so that the first surface 13a of the semiconductor element layer 13 is exposed. Thereafter, for example, a Cr layer and a AuSn layer, which is an alloy of gold and tin, are vapor deposited in order in the opening portion. Thereafter, the unnecessary metal layer is removed together with the resist film by a lift-off method to form the metal layer 14. The thickness of the metal layer is from approximately 1 μm to approximately 5 μm.

After the metal layer 14 is formed, the underlying substrate 11, the mask 12 formed on the underlying substrate 11, the semiconductor element layer 13, and the metal layer 14 are immersed in BHF for approximately 10 minutes to remove the mask 12. As a result, as illustrated in FIG. 2C, a semiconductor element 15 is formed on the underlying substrate 11. The semiconductor element 15 and the underlying substrate 11 are connected to each other via, for example, a connecting portion 13b having a columnar shape, which is a portion of the semiconductor element layer 13 grown in the opening portion 12b of the mask 12. The metal layer 14 can be used as an electrode of the semiconductor element 15. However, depending on the configuration of the semiconductor element 15, the metal layer 14 need not necessarily be used as the electrode. An upper surface 15a of the semiconductor element 15 is inclined similarly to the first surface 13a of the semiconductor element layer 13. The semiconductor element layer 13 has the first surface 13a and the second surface 13c located on the opposite side to the first surface 13a.

(2) Preparing Step S2

Figure 5:
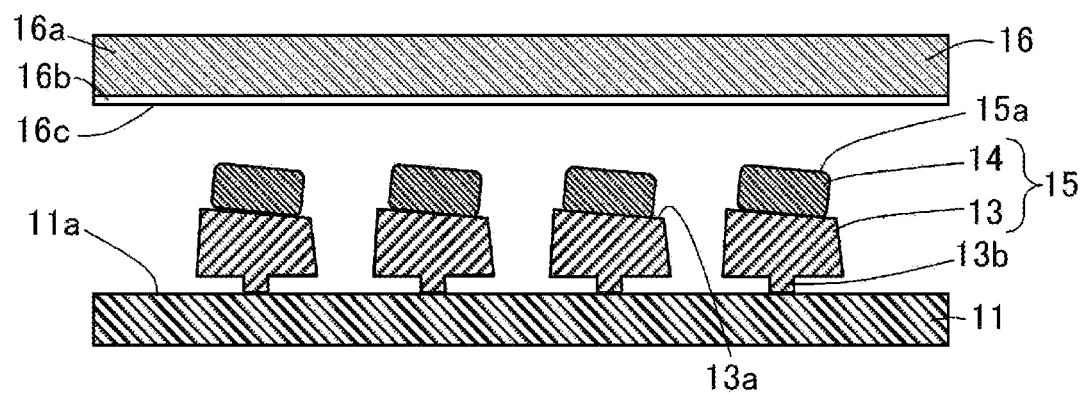
FIG. 5 is a cross-sectional view illustrating a preparing step according to the first embodiment.

FIG. 5 is a cross-sectional view illustrating a preparing step according to the first embodiment. Subsequently, a support substrate 16 for connecting to the semiconductor element 15 is prepared. In the support substrate 16, a silicon substrate is used as a base 16a. A metal layer 16b, such as Au, is formed on one surface of the base 16a, and a surface of the metal layer 16b is an opposing surface 16c to face the underlying substrate 11. The metal layer 16b facilitates bonding of the semiconductor element 15 to the support substrate 16.

Subsequently, the semiconductor element 15 is connected to the support substrate 16 by using a substrate bonding apparatus (not illustrated). First, the underlying substrate 11 and the support substrate 16 are attached to the substrate bonding apparatus so that the growth surface 11a of the underlying substrate 11 and the opposing surface 16c of the support substrate 16 are parallel to each other.

(3) Bonding Step S3

Figure 6A:
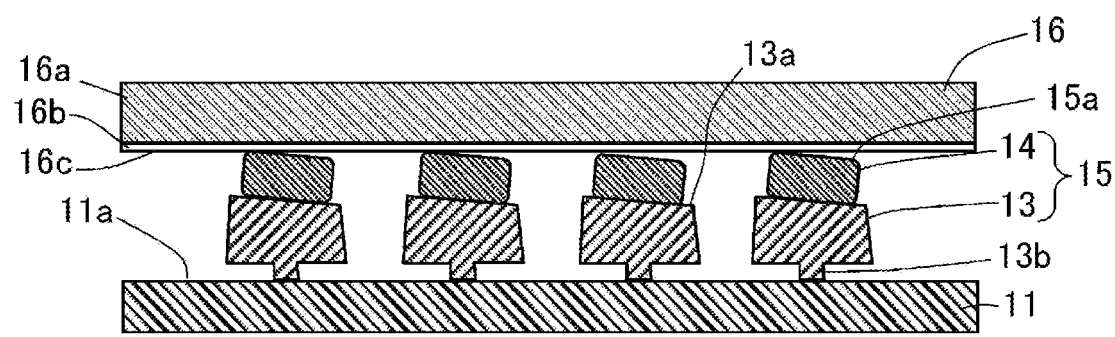
FIG. 6A is a cross-sectional view illustrating a bonding step according to the first embodiment.

FIG. 6 is a cross-sectional view illustrating a bonding step according to the first embodiment. Subsequently, as illustrated in FIG. 6(a), the opposing surface 16c of the support substrate 16 and the upper surface 15a of the semiconductor element 15 are brought into contact with each other. Since the first surface 13a of the semiconductor element layer 13 is inclined as described above, the upper surface 15a of the semiconductor element 15, which is the upper surface of the metal layer 14 formed on the first surface 13a, is also inclined.

Figure 6B:
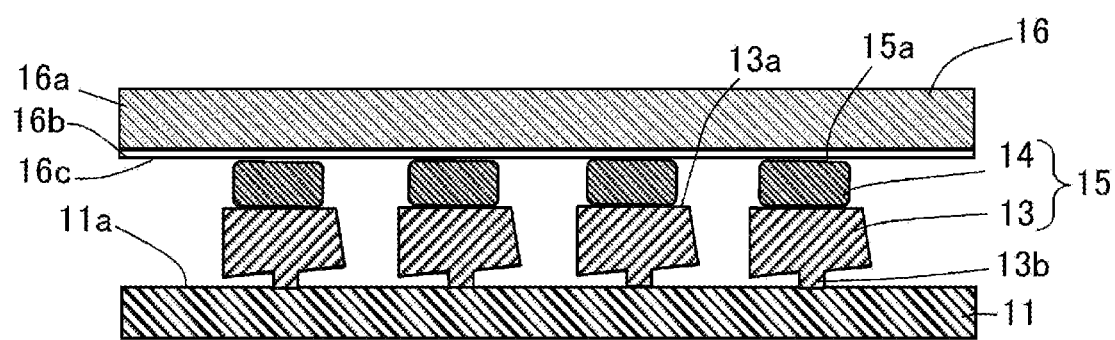
FIG. 6B is a cross-sectional view illustrating the bonding step according to the first embodiment.

Subsequently, as illustrated in FIG. 6(b), the support substrate 16 is pressed such that the metal layer 14 is pressed into close contact with the support substrate 16, and then heated to, for example, 300° C. to perform AuSn bonding. However, the bonding is not limited to AuSn bonding, and various bonding methods using other materials are possible. At this time, the semiconductor element 15 is displaced so that the entire surface of the upper surface 15a of the semiconductor element 15 abuts against the opposing surface 16c. As a result, a large stress is generated in the connecting portion 13b of the semiconductor element layer 13, and the connecting portion 13b is broken.

(4) Peeling Step S4

Figure 7:
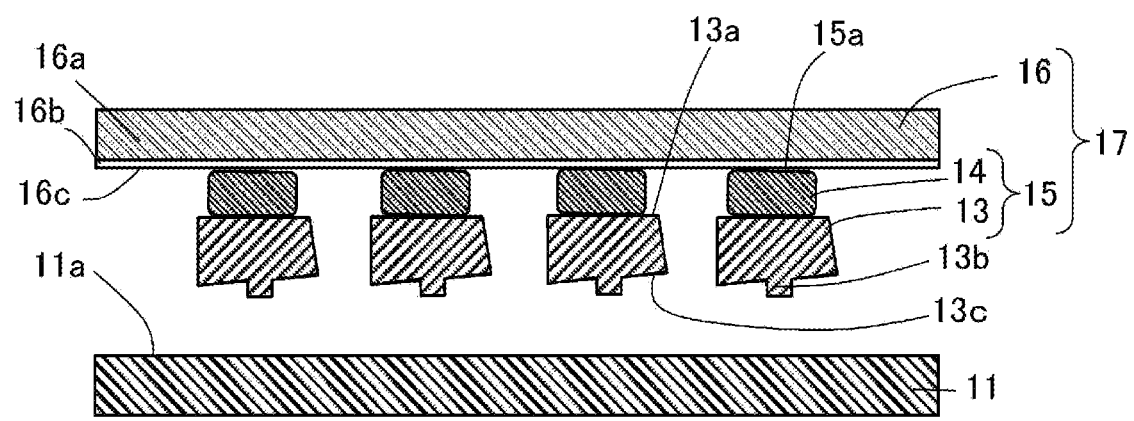
FIG. 7 is a cross-sectional view illustrating a peeling step according to the first embodiment.

FIG. 7 is a cross-sectional view illustrating a peeling step according to the first embodiment. After cooling the substrate bonding apparatus, the underlying substrate 11 and the support substrate 16 are taken out from the substrate bonding apparatus. At this time, the semiconductor element 15 is bonded onto the support substrate 16, and the connecting portion 13b is broken, so that the underlying substrate 11 can be easily peeled off. In the drawing, the connecting portion 13b having the columnar shape is attached to the semiconductor element layer 13. It is conceivable that the connecting portion 13b remains on the underlying substrate 11 side, the semiconductor element 15 side, or both, depending on the condition of the breakage. Thus, after the peeling, the connecting portion 13b remaining in the semiconductor element 15 is removed by polishing or the like.

In a semiconductor element body 17 bonded and peeled by the method described above, the first surface 13a of the semiconductor element layer 13 is parallel to the opposing surface 16c, which is a surface of the support substrate 16. On the other hand, the second surface 13c of the semiconductor element layer 13 is inclined with respect to the surface of the support substrate 16 in accordance with the inclination of the first surface 13a of the semiconductor element layer 13. Here, the first surface 13a of the semiconductor element layer 13 is considered to be parallel to the surface of the support substrate 16, when the inclination is, for example, less than 0.5°.

As described above, the semiconductor element body 17 of the first embodiment includes the support substrate 16, the first surface 13a, and the second surface 13c located on the opposite side to the first surface 13a, and the first surface 13a side is fixed to the support substrate 16. The semiconductor element body 17 includes the semiconductor element layer 13 in which the second surface 13c is inclined with respect to the surface of the support substrate 16. As a result, the semiconductor element layer 13 having excellent quality can be realized by the simple support structure.

As described above, since the semiconductor element 15 is formed with the upper surface 15a inclined with respect to the growth surface 11a of the underlying substrate 11, when being pressed in the bonding step S3, shearing stress is concentrated on the end portion of the connecting portion 13b having the columnar shape, and the connecting portion 13b is sheared. Accordingly, the semiconductor element 15 can be reliably separated from the underlying substrate 11 by simply applying pressure, without the need to separately apply a force in the vertical direction to the surface of the underlying substrate 11 by ultrasonic waves or the like. As described above, since the semiconductor element 15 can be reliably transferred to the support substrate 16 without applying excessive force to the semiconductor element 15, the yield of the semiconductor element 15 can be improved.

Second Embodiment (1) Element Forming Step S1

Figure 8A:
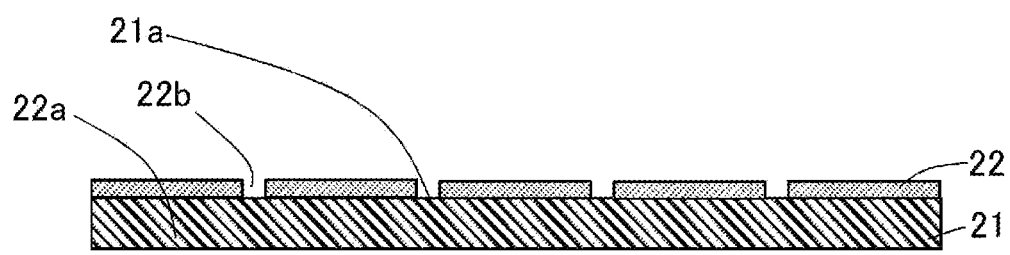
FIG. 8A is a cross-sectional view illustrating an element forming step according to a second embodiment.
Figure 8B:
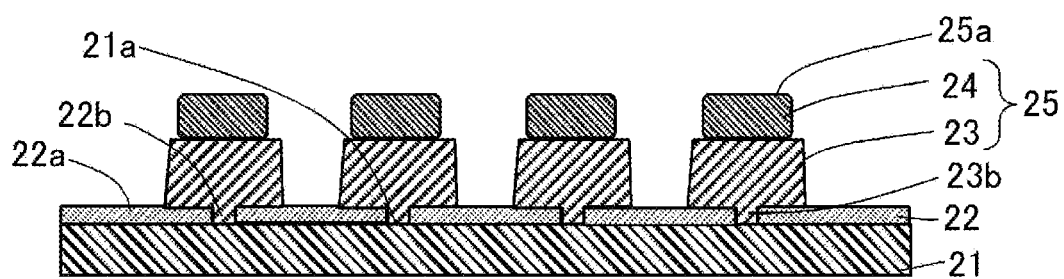
FIG. 8B is a cross-sectional view illustrating the element forming step according to the second embodiment.
Figure 8C:
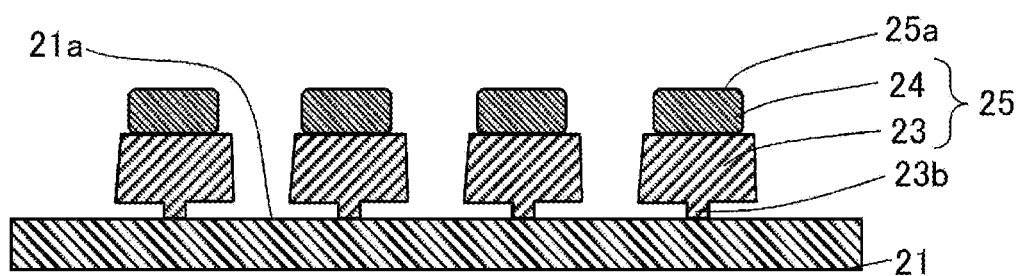
FIG. 8C is a cross-sectional view illustrating the element forming step according to the second embodiment.

FIGS. 8A to 8C are cross-sectional views illustrating an element forming step according to a second embodiment. As illustrated in FIG. 8A, an underlying substrate 21 is first prepared. For example, similar to the first embodiment, a GaN template substrate is used as the underlying substrate 21. However, a crystal plane of a growth surface 21a of the underlying substrate 21 has no off angle. A mask 22 is formed in a step similar to that in the first embodiment. The growth surface 21a is exposed through an opening portion 22b of a strip-shaped body 22a of the mask 22.

Subsequently, as illustrated in FIG. 8B, similar to the first embodiment, a semiconductor element layer 23, which is a crystal growth layer of a nitride semiconductor, is vapor phase grown from the growth surface 20a exposed from the opening portion 22b of the strip-shaped body 22a. Thereafter, a metal layer 24, such as, for example, a AuSn alloy, is formed on a first surface 23a of the semiconductor element layer 23.

Subsequently, as illustrated in FIG. 8C, a semiconductor element 25 is formed on the underlying substrate 21 by etching the mask 22 on the underlying substrate 21. The first surface 23a of the semiconductor element layer 23 and an upper surface 25a of the semiconductor element 25 are substantially parallel to the growth surface 21a of the underlying substrate 21. Also, in the second embodiment, similar to the first embodiment, the semiconductor element layer 23 has the first surface 23a and a second surface 23c located on the opposite side to the first surface 23a.

(2) Preparing Step S2

Figure 9:
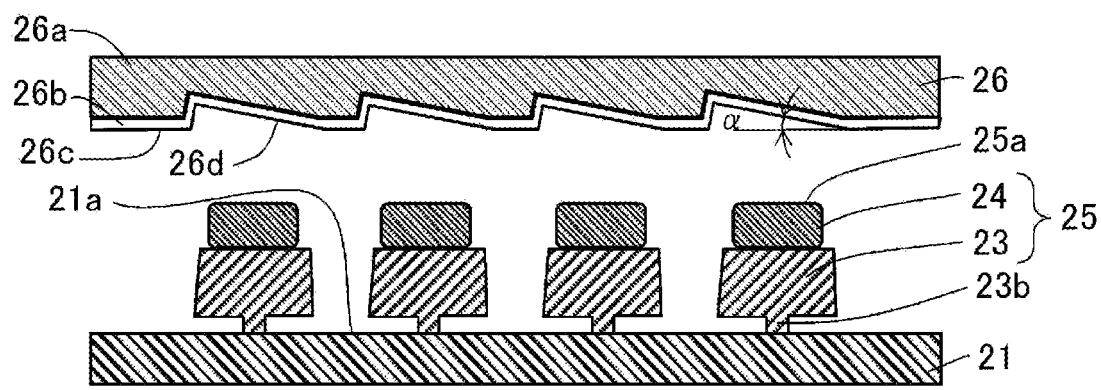
FIG. 9 is a cross-sectional view illustrating a preparing step according to the second embodiment.

FIG. 9 is a cross-sectional view illustrating a preparing step according to the second embodiment. Subsequently, a support substrate 26 for bonding to the semiconductor element 25 is prepared. For example, a silicon substrate is used as a base 26a of the support substrate 26. The silicon substrate is, for example, an off-angle substrate with a plane direction having an off angle of 0.3° from (111), in other words, the support substrate 26 has an opposing surface 26c caused to face the underlying substrate 21. As the support substrate 26, an off-angle substrate, in which the opposing surface 26c is a crystal plane having an off angle with respect to the normal line of the opposing surface 26c, can be used. A photoresist film having a stripe shape is formed on such an off-angle substrate, and anisotropic etching with potassium hydroxide (KOH) aqueous solution is performed, so that an inclined surface 26d is provided on the base 26a. Furthermore, a metal layer 26b, such as gold, is formed on the silicon substrate by a vapor deposition method or the like. The support substrate 26 formed in this manner has the opposing surface 26c having the inclined surface 26d. An inclination angle α of the inclined surface 26d is approximately the same as the off angle.

The opposing surface 26c of the support substrate 26 is inclined with respect to the underlying substrate 21 by the angle α. The opposing surface 26c is formed for each row of semiconductor elements 25 arranged on the underlying substrate 21. Accordingly, it is preferable that a pitch at which the semiconductor elements 25 are disposed on the underlying substrate 21 and a pitch at which the plurality of the inclined surfaces 26d are formed on the support substrate 26 coincide with each other. Subsequently, the semiconductor element 25 is connected to the support substrate 16 by using a substrate bonding apparatus (not illustrated). First, the underlying substrate 21 and the opposing surface 26c are attached to the substrate bonding apparatus such that the growth surface 21a of the underlying substrate 21 and the opposing surface 26c of the support substrate 26 face each other.

(3) Bonding Step S3

Figure 10A:
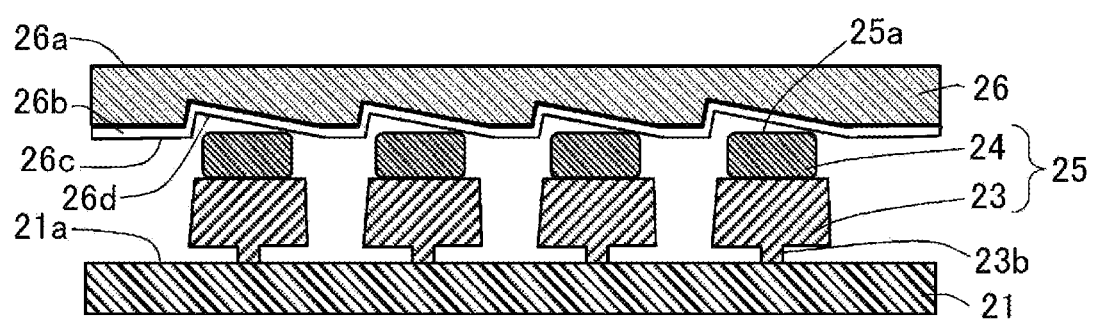
FIG. 10A is a cross-sectional view illustrating a bonding step according to the second embodiment.
Figure 10B:
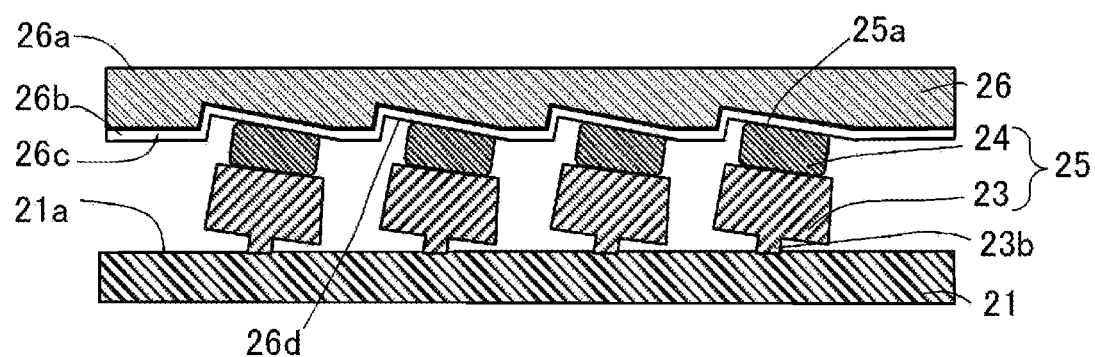
FIG. 10B is a cross-sectional view illustrating a bonding step according to the second embodiment.

FIGS. 10A and 10B are cross-sectional views illustrating a bonding step according to the second embodiment. As illustrated in FIG. 10A, the opposing surface 26c of the support substrate 26 and the upper surface 25a of the semiconductor element 25 are brought into contact with each other. The opposing surface 26c of the support substrate 26 is inclined. As such, a portion of the upper surface 25a of the semiconductor element 25 is in contact with the opposing surface 26c. Subsequently, as illustrated in FIG. 10B, the support substrate 26 is pressed such that the upper surface 25a of the semiconductor element 25 is pressed into close contact with the opposing surface 26c of the support substrate 26, and then heated to, for example, 300° C. to perform AuSn bonding. At this time, the semiconductor element 25 is displaced so that the entire surface of the upper surface 25a of the semiconductor element 25 abuts against the opposing surface 26c. As a result, a large shearing stress is generated in an end portion of the connecting portion 23b of the semiconductor element layer 23, and the connecting portion 23b is broken.

(4) Peeling Step S4

Figure 11:
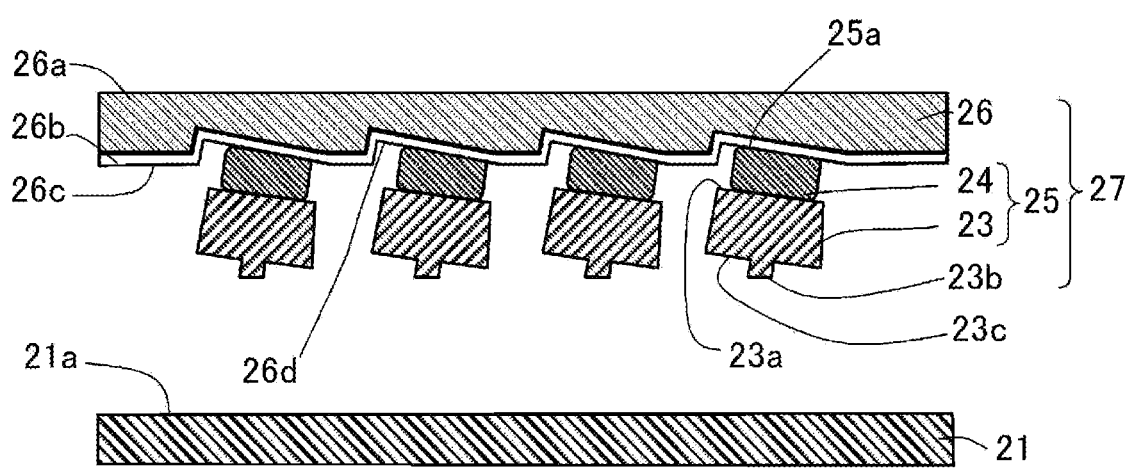
FIG. 11 is a cross-sectional view illustrating a peeling step according to the second embodiment.

FIG. 11 is a cross-sectional view illustrating a peeling step according to the second embodiment. When the underlying substrate 21 and the support substrate 26 are taken out from the substrate bonding apparatus after the substrate bonding apparatus is cooled, the semiconductor element 25 is bonded to the opposing surface 26c of the support substrate 26, and the connecting portion 23b is broken, so that the underlying substrate 21 can be easily peeled off. In the drawing, for example, the connecting portion 23b having a columnar shape is attached to the semiconductor element layer 23; however, the connecting portion 23b can be removed by polishing or the like.

As described above, prior to the bonding step S3, the opposing surface 26c of the support substrate 26 is inclined with respect to the growth surface 21a of the underlying substrate 21 or the upper surface 25a of the semiconductor element 25. Thus, when the upper surface 25a of the semiconductor element 25 is pressed against the opposing surface 26c of the support substrate 26 in the bonding step S3, shearing stress is concentrated on an end portion of the connecting portion 23b, and the connecting portion 23b is sheared. Accordingly, the semiconductor element 25 can be reliably separated from the underlying substrate 21 by simply applying pressure with the substrate bonding apparatus, even without the need to apply a force of ultrasonic waves or the like. As described above, the semiconductor element 25 can be reliably transferred to the support substrate 26 by simply applying a force smaller than that in the related art to the semiconductor element 25. Thus, the yield of the semiconductor element 25 can be improved.

In a semiconductor element body 27 bonded and peeled by the method described above, a portion of the opposing surface 26c of the support substrate 26 is inclined.

As described above, the semiconductor element body 27 of the second embodiment includes the support substrate 26, the first surface 23a, and the second surface 23c located on the opposite side to the first surface 23a, and the first surface 23a side is fixed to the support substrate 26. The semiconductor element body 27 includes the semiconductor element layer 23 in which the second surface 23c is inclined with respect to the surface of the support substrate 26. As a result, since the support substrate 26 also has an inclined surface, the semiconductor element body 27 is easily cleaved or the like, which facilitates the separation of the semiconductor element body 27 into individual semiconductor elements 25.

Third Embodiment (1) Element Forming Step S1

In a third embodiment, the underlying substrate used in the element forming step S1 and the formed semiconductor element are similar to those in the second embodiment, and thus descriptions thereof are omitted and the same reference numerals are used.

(2) Preparing Step S2

Figure 12:
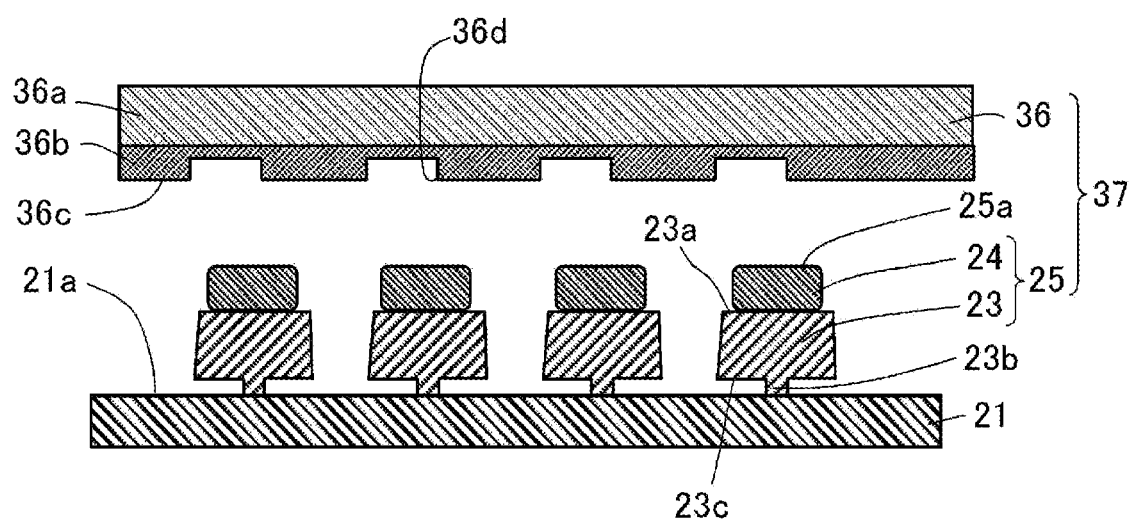
FIG. 12 is a cross-sectional view illustrating a preparing step according to a third embodiment.

FIG. 12 is a cross-sectional view illustrating a preparing step according to the third embodiment. A support substrate 36 for bonding to a semiconductor element 25 is prepared. For example, a silicon substrate is used as a base 36a of the support substrate 36. As the base 36a, for example, a c-plane substrate having a plane direction of (100) may be used. First, a layer in which, for example, titanium (Ti) is used as an underlying layer and a Au layer is layered thereon is formed on the base 36a. A mask having a stripe shape is fabricated on the formed layer, and, for example, AuSn is vapor deposited. Thereafter, the support substrate 36, on which an opposing surface 36c of a metal layer 36b having stripe-shaped projections and recesses is formed, is obtained by a vapor deposition lift off method in which the Au layer vapor deposited on the mask is removed together with the mask. It is preferable that a pitch at which the semiconductor elements 25 are disposed on the underlying substrate 21 and a pitch of the stripe-shaped projections and recesses of the support substrate 36 coincide with each other. A stepped portion 36d is formed at the boundary between a projection portion and a recess portion of the opposing surface 36c.

(3) Bonding Step S3

Figure 13A:
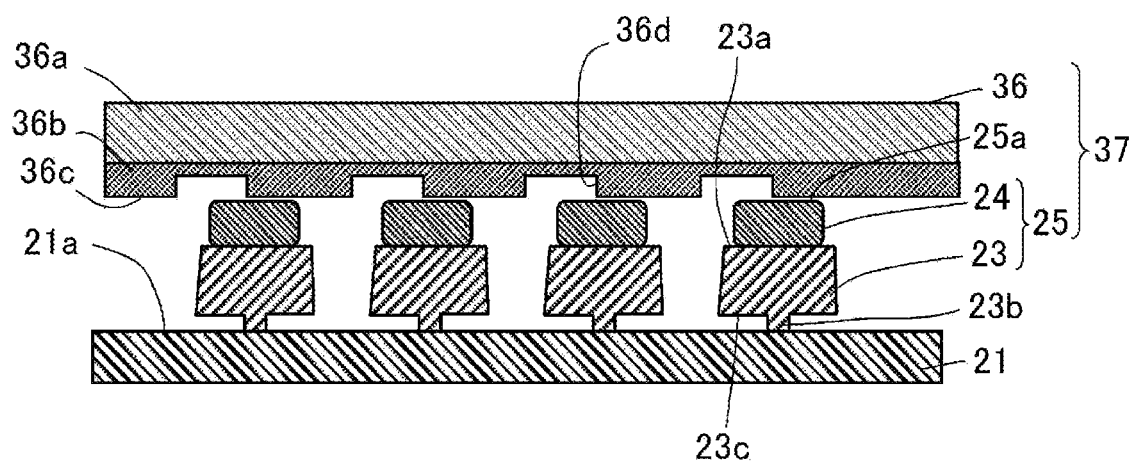
FIG. 13A is a cross-sectional view illustrating a bonding step according to the third embodiment.
Figure 13B:
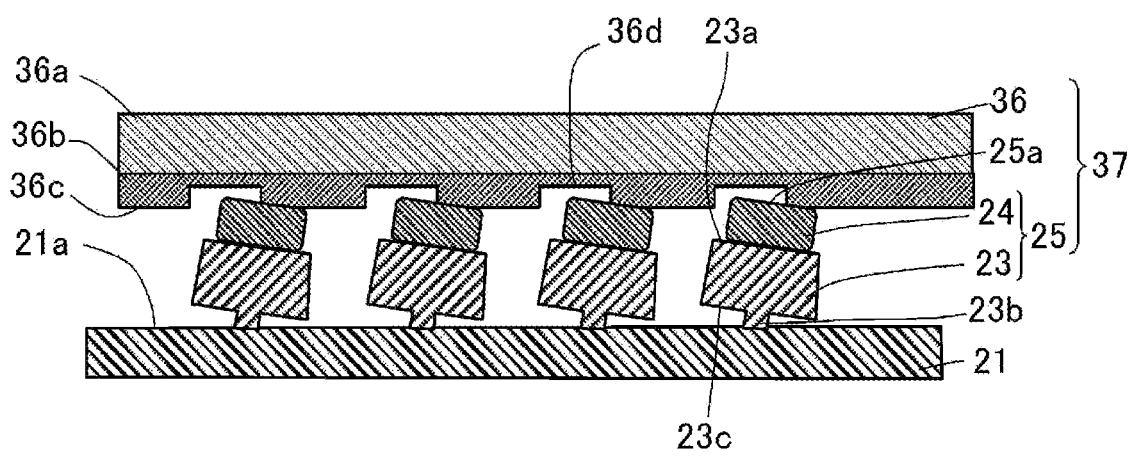
FIG. 13B is a cross-sectional view illustrating the bonding step according to the third embodiment.

The semiconductor element 25 and the support substrate 36 are bonded using a substrate bonding apparatus (not illustrated). FIGS. 13A and 13B are cross-sectional views illustrating a bonding step according to the third embodiment. As illustrated in FIG. 13A, the opposing surface 36c of the support substrate 36 and the upper surface 25a of the semiconductor element 25 are brought into contact with each other. The opposing surface 36c of the support substrate 36 includes the stepped portion 36d. Thus, a portion of the upper surface 25a of the semiconductor element 25 is in contact with the opposing surface 36c. Subsequently, as illustrated in FIG. 13B, the support substrate 36 is pressed such that the upper surface 25a is pressed against the support substrate 36, and heated to 300° C. to perform AuSn bonding. At this time, the stepped portion 36d of the opposing surface 36c abuts against the upper surface 25a of the semiconductor element 25, and the semiconductor element 25 is displaced so that the upper surface 25a of the semiconductor element 25 is in proximity to the recess portion of the opposing surface 36c. As a result, a large shearing stress is generated in the connecting portion 23b of the semiconductor element layer 23, and the connecting portion 23b is broken.

(4) Peeling Step S4

Figure 14:
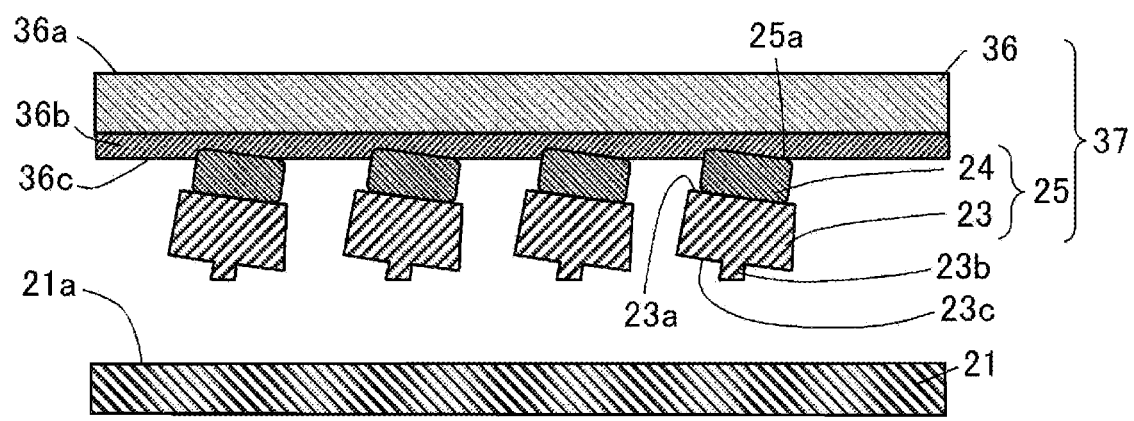
FIG. 14 is a cross-sectional view illustrating a peeling step according to the third embodiment.

FIG. 14 is a cross-sectional view illustrating a peeling step according to the third embodiment. When the underlying substrate 21 and the support substrate 36 are taken out from the substrate bonding apparatus after the substrate bonding apparatus is cooled, the semiconductor element 25 is bonded onto the support substrate 36, and the connecting portion 23b is broken, so that the underlying substrate 21 can be easily peeled off. At this time, the opposing surface 36c becomes flat by the bonding step S3, and the metal layer 36b and the metal layer 24 are integrally formed. In other words, the first surface 23a of the semiconductor element layer 23 is also fixed, via a metal, to the opposing surface 36c, which is a surface of the support substrate 36. In the drawing, for example, the connecting portion 23b having a columnar shape is attached to the semiconductor element layer 23; however, the connecting portion 23b can be removed by polishing or the like.

As described above, the opposing surface 36c of the support substrate 36 includes the stepped portion 36d. Thus, when the upper surface 25a of the semiconductor element 25 is pressed against the opposing surface 36c in the bonding step S3, shearing stress is concentrated on the end portion of the connecting portion 23b on the underlying substrate 21 side, and the connecting portion 23b is sheared. Accordingly, the semiconductor element 25 can be reliably separated from the underlying substrate 21 by simply applying pressure, even without the need to apply a force, such as ultrasonic waves. As described above, the semiconductor element 25 can be reliably transferred to the support substrate 36 by simply applying a force smaller than that in the related art to the semiconductor element 25, and hence the yield of the semiconductor element 25 can be improved.

In a semiconductor element body 37 bonded and peeled by the method described above, the first surface 23a of the semiconductor element layer 23 is inclined in accordance with the structure of the stepped portion 36d, with respect to the opposing surface 36c, which is a surface of the support substrate 36.

As described above, the semiconductor element body 37 of the third embodiment includes the support substrate 36, the first surface 23a, and the second surface 23c located on the opposite side to the first surface 23a, and the first surface 23a side is fixed to the support substrate 26. In the semiconductor element body 37, at least the first surface 23a of the first surface 23a and the second surface 23c is inclined with respect to the surface of the support substrate 36. As a result, the support substrate 26 can also be configured to have the inclined surface with the simple structure, and similarly to the second embodiment, the semiconductor element body 37 is easily cleaved or the like, which facilitates separation of the semiconductor element body 37 into individual semiconductor elements 25.

The present disclosure has been described in detail above. However, the present disclosure is not limited to the embodiments described above, and various modifications or improvements can be made without departing from the essential spirit of the present disclosure. Accordingly, the foregoing embodiment is merely illustrative in all respects, and the scope of the present invention is as set forth in the claims and is in no way limited by the specification. Furthermore, any variations or modifications that fall within the scope of the claims are also within the scope of the present invention.

REFERENCE SIGNS LIST

S1 Element forming step
S2 Preparing step
S3 Bonding step
S4 Peeling step
11, 21 Underlying substrate
13, 23 Semiconductor element layer
13a, 23a First surface
13b, 23b Connecting portion
13c, 23c Second surface
14, 24, 16b, 26b, 36b Metal layer
15, 25 Semiconductor element
15a, 25a Upper surface
16, 26, 36 Support substrate
16c, 26c, 36c Opposing surface
17, 27, 37 Semiconductor element body

The invention claimed is:

1. A method of manufacturing a semiconductor element comprising:
preparing an underlying substrate, a semiconductor element which has a connecting portion having a columnar shape and being formed by crystal growth from the underlying substrate, and a support substrate facing the underlying substrate;
bonding the upper surface of the semiconductor element to the support substrate by pressing the upper surface of the semiconductor element against the support substrate and heating the upper surface; and
peeling the semiconductor element from the underlying substrate,
wherein in the bonding, when the upper surface of the semiconductor element is pressed against the support substrate in a thickness direction of the support substrate, a stress concentrates on an end portion of the connecting portion so that the connecting portion is broken, and
wherein in the bonding, the connecting portion is inclined with respect to the underlying substrate so that a stress concentrates on the end portion of the connecting portion.

2. The method according to claim 1, wherein in the bonding, when the upper surface of the semiconductor element is pressed against the support substrate in the thickness direction of the support substrate, a force to incline the semiconductor element is applied on the semiconductor element.

3. The method according to claim 1, wherein the semiconductor element is formed by a growth of an ELO method and stopping the growth before the semiconductor element meets an adjacent semiconductor element.

4. A method of manufacturing a semiconductor element comprising:
preparing an underlying substrate, a semiconductor element which has a connecting portion having a columnar shape and being formed by crystal growth from the underlying substrate, and a support substrate facing the underlying substrate;
bonding the upper surface of the semiconductor element to the support substrate by pressing the upper surface of the semiconductor element against the support substrate and heating the upper surface; and
peeling the semiconductor element from the underlying substrate,
wherein in the bonding, when the upper surface of the semiconductor element is pressed against the support substrate in a thickness direction of the support substrate, a stress concentrates on an end portion of the connecting portion so that the connecting portion is broken,
wherein the upper surface of the semiconductor element is inclined with respect to a growth surface of the underlying substrate.

5. The method according to claim 4, wherein the growth surface of the underlying substrate is a crystal plane with an off angle.

6. A method of manufacturing a semiconductor element comprising:
preparing an underlying substrate, a semiconductor element which has a connecting portion having a columnar shape and being formed by crystal growth from the underlying substrate, and a support substrate facing the underlying substrate;
bonding the upper surface of the semiconductor element to the support substrate by pressing the upper surface of the semiconductor element against the support substrate and heating the upper surface; and
peeling the semiconductor element from the underlying substrate,
wherein in the bonding, when the upper surface of the semiconductor element is pressed against the support substrate in a thickness direction of the support substrate, a stress concentrates on an end portion of the connecting portion so that the connecting portion is broken,
wherein the support substrate has, on a side facing the semiconductor element, a plurality of inclined surfaces which are inclined with respect to the growth surface of the underlying substrate.

7. A method of manufacturing a semiconductor element comprising:
preparing an underlying substrate, a semiconductor element which has a connecting portion having a columnar shape and being formed by crystal growth from the underlying substrate, and a support substrate facing the underlying substrate;
bonding the upper surface of the semiconductor element to the support substrate by pressing the upper surface of the semiconductor element against the support substrate and heating the upper surface; and
peeling the semiconductor element from the underlying substrate,
wherein in the bonding, when the upper surface of the semiconductor element is pressed against the support substrate in a thickness direction of the support substrate, a stress concentrates on an end portion of the connecting portion so that the connecting portion is broken,
  wherein the support substrate has a facing surface which faces the underlying substrate, and the facing surface has a stepped portion.

8. The method according to claim 7, wherein in the bonding, a part of the upper surface of the semiconductor element is in contact with the stepped portion.

* * * * *